United States Patent
Yeh et al.

(10) Patent No.: US 8,238,093 B2
(45) Date of Patent: Aug. 7, 2012

(54) COMPUTER SYSTEM WITH DUCT

(75) Inventors: Chin-Wen Yeh, Taipei Hsien (TW); Zhen-Neng Lin, Shenzhen (CN); Yang Xiao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 182 days.

(21) Appl. No.: 12/759,832

(22) Filed: Apr. 14, 2010

(65) Prior Publication Data

US 2011/0134603 A1    Jun. 9, 2011

(30) Foreign Application Priority Data

Dec. 3, 2009 (CN) .................... 2009 2 0316482 U

(51) Int. Cl.
*H05K 7/20* (2006.01)
*F28F 7/00* (2006.01)
*H01L 23/34* (2006.01)

(52) U.S. Cl. ......... 361/679.49; 361/679.47; 361/679.51; 361/697; 361/719; 165/80.3; 257/722

(58) Field of Classification Search ............ 361/679.47, 361/679.49, 679.51, 695, 697, 703, 709–710, 361/719; 165/80.3, 185; 257/722; 454/184; 312/236

See application file for complete search history.

(56) References Cited

U.S. PATENT DOCUMENTS

| 7,403,388 | B2* | 7/2008 | Chang ......................... 361/695 |
| 7,611,402 | B2* | 11/2009 | McClellan et al. ........... 454/184 |
| 7,758,308 | B2* | 7/2010 | Wu et al. .................... 415/214.1 |
| 2007/0091566 | A1* | 4/2007 | Sun ............................. 361/695 |
| 2010/0002375 | A1* | 1/2010 | Yao et al. ................. 361/679.49 |
| 2010/0097754 | A1* | 4/2010 | Li et al. .................... 361/679.49 |
| 2010/0319886 | A1* | 12/2010 | Zeng et al. .................... 165/122 |

* cited by examiner

*Primary Examiner* — Zachary M Pape
(74) *Attorney, Agent, or Firm* — Altis Law Group, Inc.

(57) ABSTRACT

A computer system includes a chassis, a motherboard, a heat sink, a duct and a fan. The chassis includes a chassis bottom wall. The motherboard with a chip is secured to the chassis bottom wall. The heat sink is secured to the motherboard for cooling the chip. The duct includes a guiding portion and a latch portion located on the guiding portion. The latch portion is secured to the chassis bottom wall. The guiding portion is adjacent to the heat sink to direct airflow to the heat sink. The fan is secured on the latch portion of the duct. The guiding portion of the duct is positioned between the heat sink and the fan.

16 Claims, 5 Drawing Sheets

COMPUTER SYSTEM WITH DUCT

BACKGROUND

1. Technical Field

The present disclosure relates to a computer system with a duct to guide airflow.

2. Description of Related Art

Commonly, a heat sink and a fan are disposed in a computer system for cooling a CPU of a motherboard. However, the fan cannot concentrate the airflow from the fan to flow through the heat sink.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
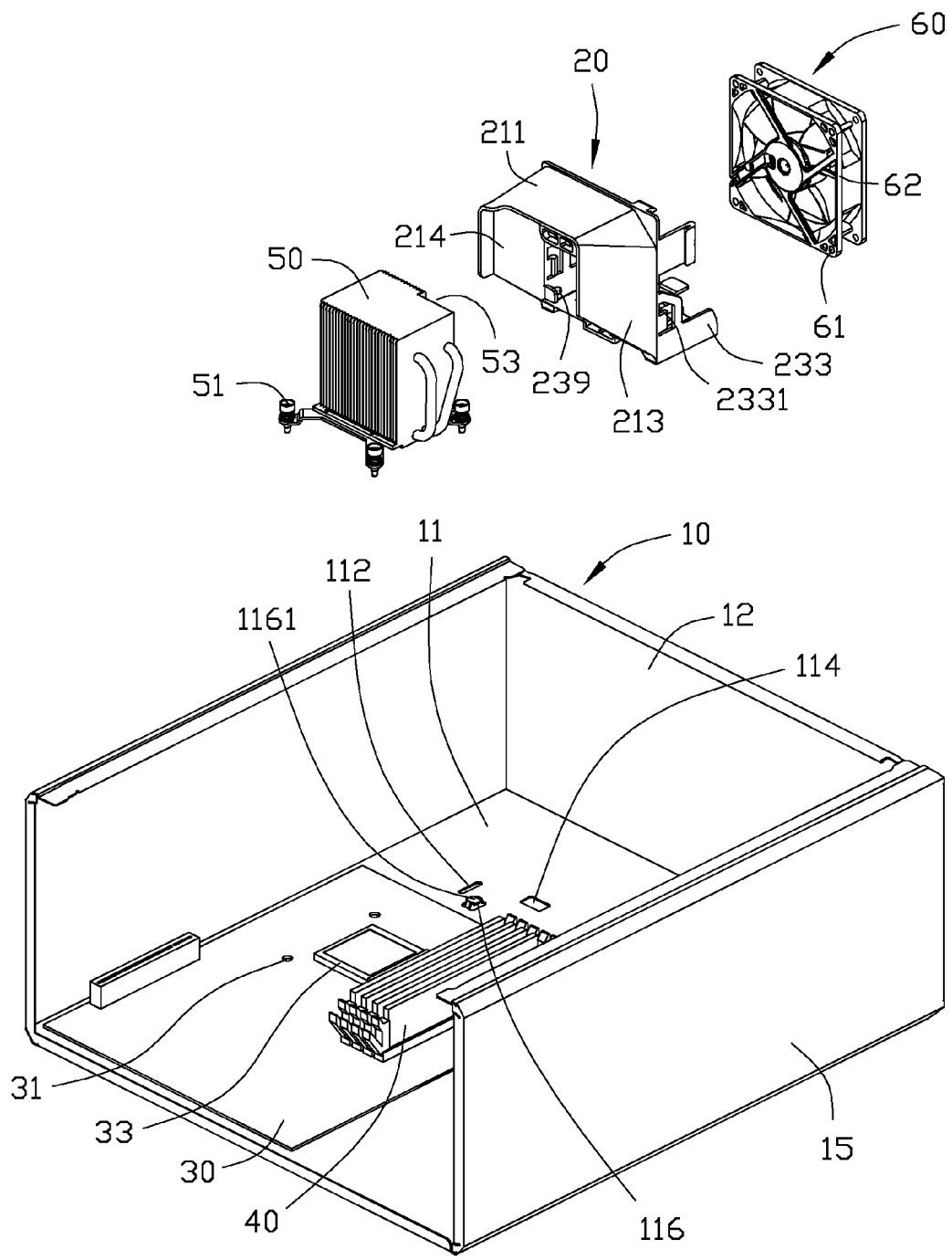
FIG. 1 is an exploded view of a computer system in accordance with an embodiment.

Referring to FIG. 1, a computer system in accordance with an embodiment includes a chassis 10 and a duct 20.

The chassis 10 includes a chassis bottom wall 11, a chassis front wall 12 connected to the chassis bottom wall 11, and two substantially parallel chassis sidewalls 15 connected to the chassis bottom wall 11 and the chassis front wall 12. In an embodiment, the chassis front wall 12 and the chassis sidewalls 15 are substantially perpendicular to the chassis bottom wall 11, and the chassis front wall 12 is substantially perpendicular to the chassis sidewalls 15. Two sliding slots 112 and a positioning opening 114 are defined in the chassis bottom wall 11. The sliding slots 112 extend in a direction substantially perpendicular to the chassis front wall 12. Two blocking pieces 1161 are located on an inner surface of the chassis bottom wall 11. In an embodiment, two blocking openings 116 are defined in the chassis bottom wall 11, and each blocking piece 1161 extends from an edge of a corresponding one of the blocking openings 116.

A motherboard 30 is fixed on the inner surface of the chassis bottom wall 11. The sliding slots 112, the positioning opening 114, and the blocking pieces 1161 are positioned between the motherboard 30 and the chassis front wall 12. A chip 33, such as a CPU, is secured to the motherboard 30. Four securing holes 31 are defined in the motherboard 30 around the chip 33. A plurality of memory cards 40 are secured to the motherboard 30 at one side of the chip 33.

A heat sink 50 is secured to the motherboard 30 on the chip 33 by four fasteners 51, such as screws or bolts, secured in the securing holes 31. The heat sink 50 has a cutout 53.

Figure 2:
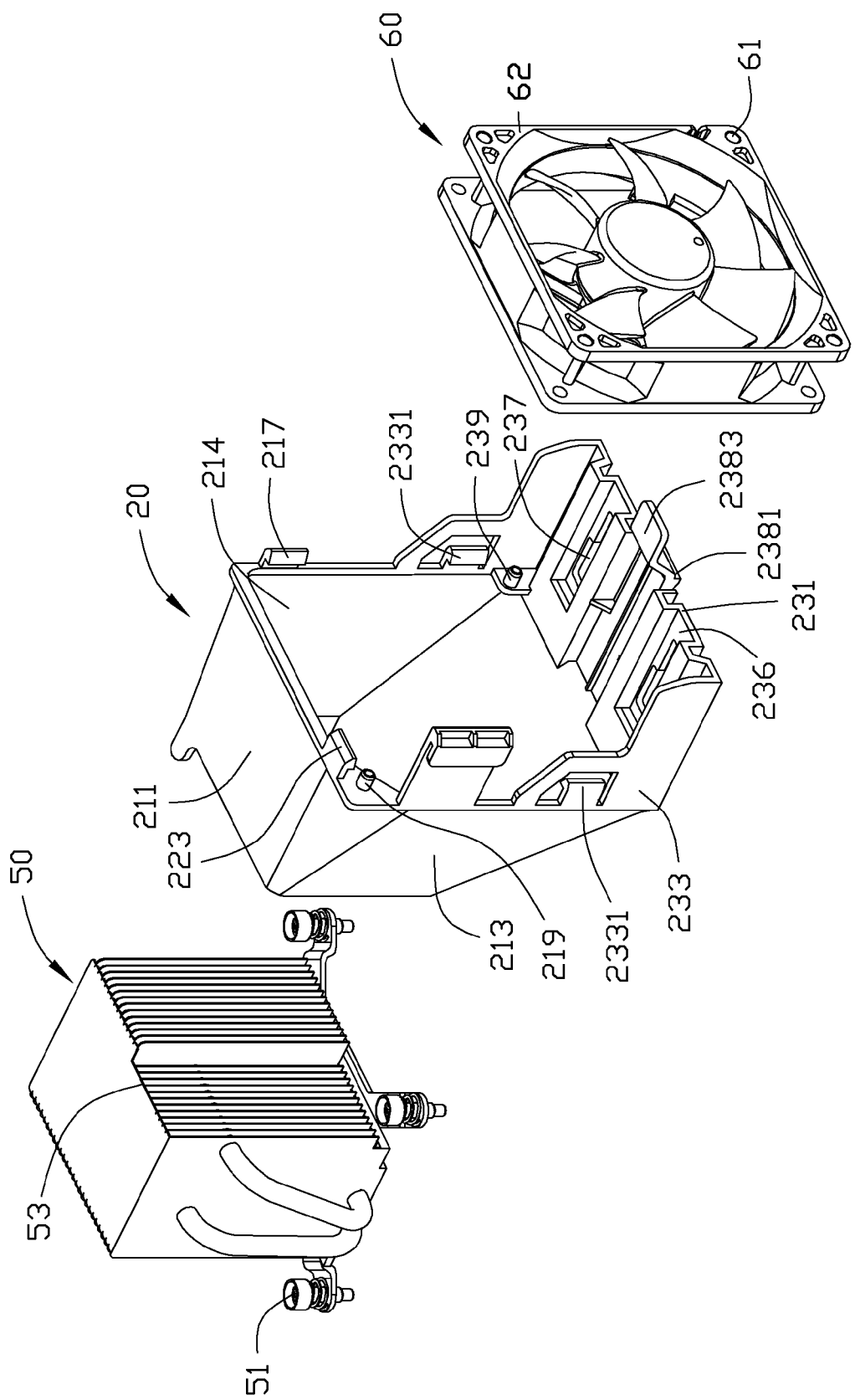
FIG. 2 is an exploded view of an embodiment of a heat sink, a duct, and a fan of the computer system of FIG. 1.
Figure 3:
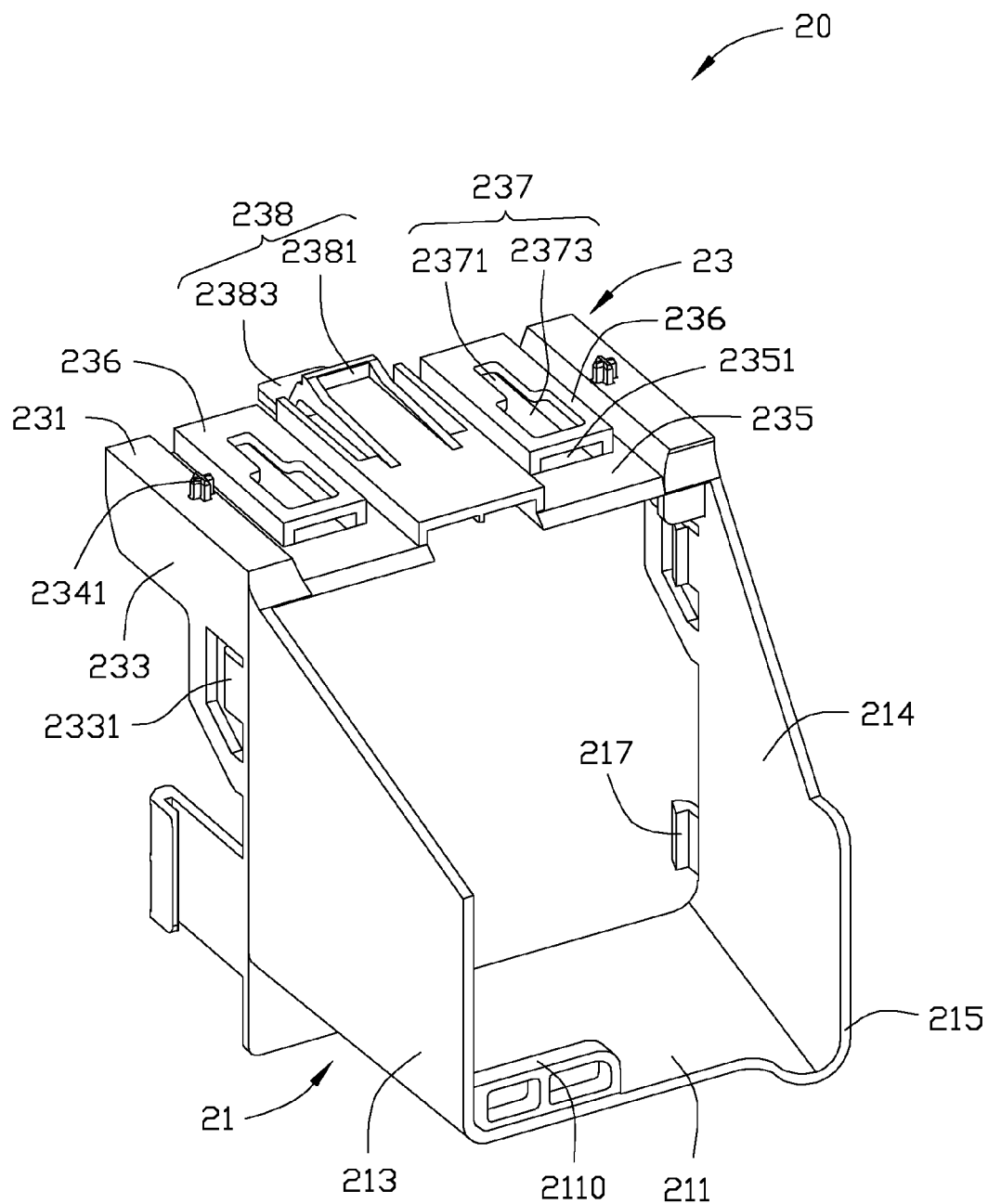
FIG. 3 is an isometric view of an embodiment of the duct of the computer system of FIG. 1.

Referring to FIGS. 2 and 3, the duct 20 includes a guiding portion 21 and a latch portion 23 located on the guiding portion 21. The guiding portion 21 includes a first guiding wall 211, a second guiding wall 213 and a third guiding wall 214. The first guiding wall 211 is connected between the second guiding wall 213 and the third guiding wall 214. A limiting portion 2110 is located at a corner between the first guiding wall 211 and the second guiding wall 213. A guiding portion hook 217 is located on the third guiding wall 214. A first positioning post 219 is located at a corner between the first guiding wall 211 and the second guiding wall 213.

The latch portion 23 includes a first latch wall 231, and two second latch walls 233 located on the second and third guiding walls 213, 214. The first latch wall 231 is connected between the second latch walls 233. Two convex portions 235 are disposed in the first latch wall 231 and protrude inside the duct 20. A resiliently deformable clip 238 is located on the first latch wall 231 between the convex portions 235. The clip 238 includes a locking portion 2381 and an operating portion 2383. Two concave portions 236 are located in the two convex portions 235. Each concave portion 236 defines a receiving opening 237. Each receiving opening 237 includes a small portion 2371 configured for securing the corresponding blocking piece 1161, and a big portion 2373 configured for insertion of the blocking piece 1161. Two sliding posts 2341 are located on the first latch wall 231 at opposite sides of the convex portions 235, for slidably engaging in the sliding slots 112 of the bottom wall 11. Each second latch wall 233 has a resiliently deformable latch hook 2331. A second positioning post 239 is located at a corner between the first latch wall 231 and one second latch wall 233.

A fan 60 is configured to be secured to the duct 20 and includes two parallel fan walls 62. Each fan wall 62 defines four mounting holes 61 that respectively receive the first and second positioning posts 219, 239.

Figure 4:
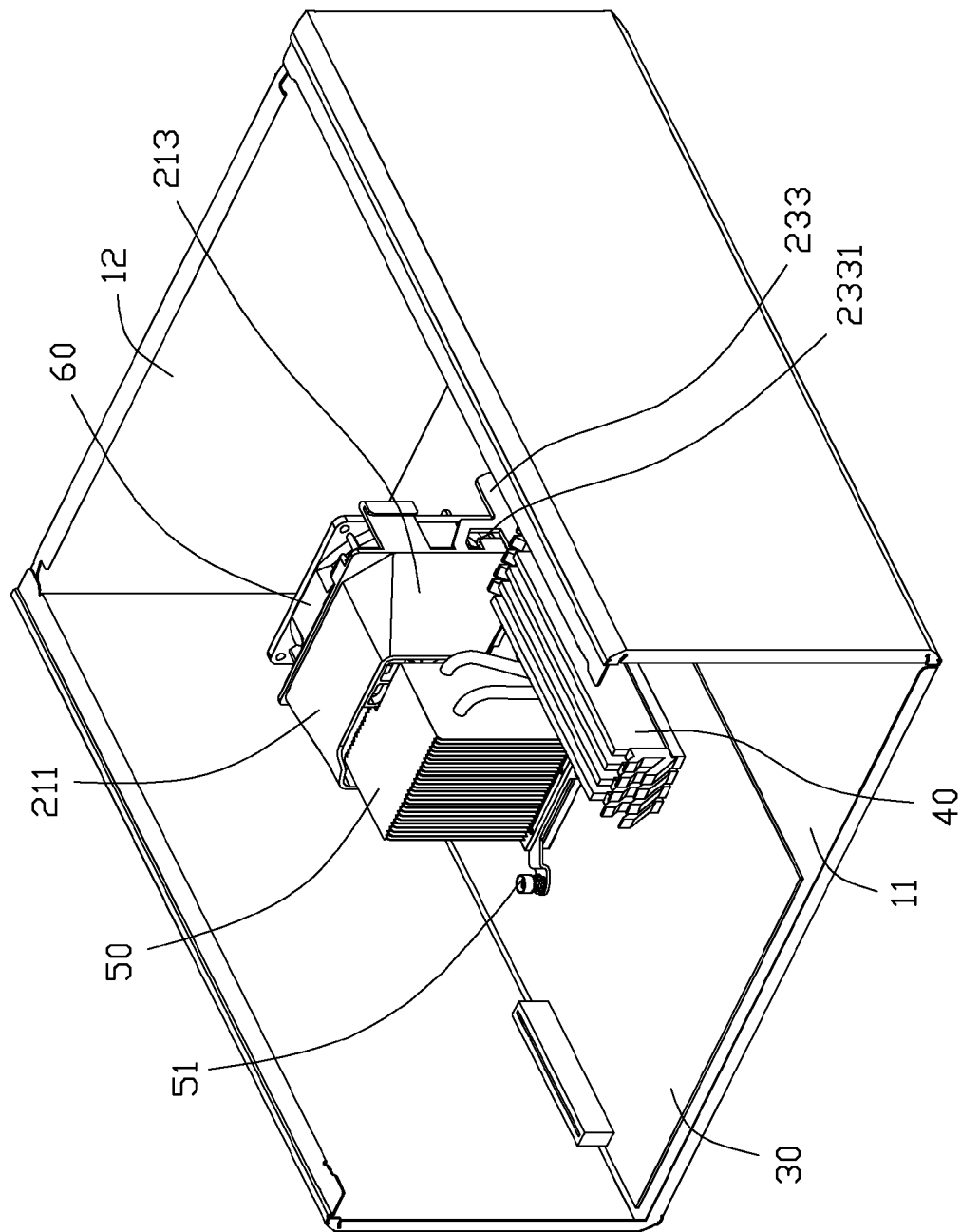
FIG. 4 is an assembled view of an embodiment of the computer system of FIG. 1.
Figure 5:
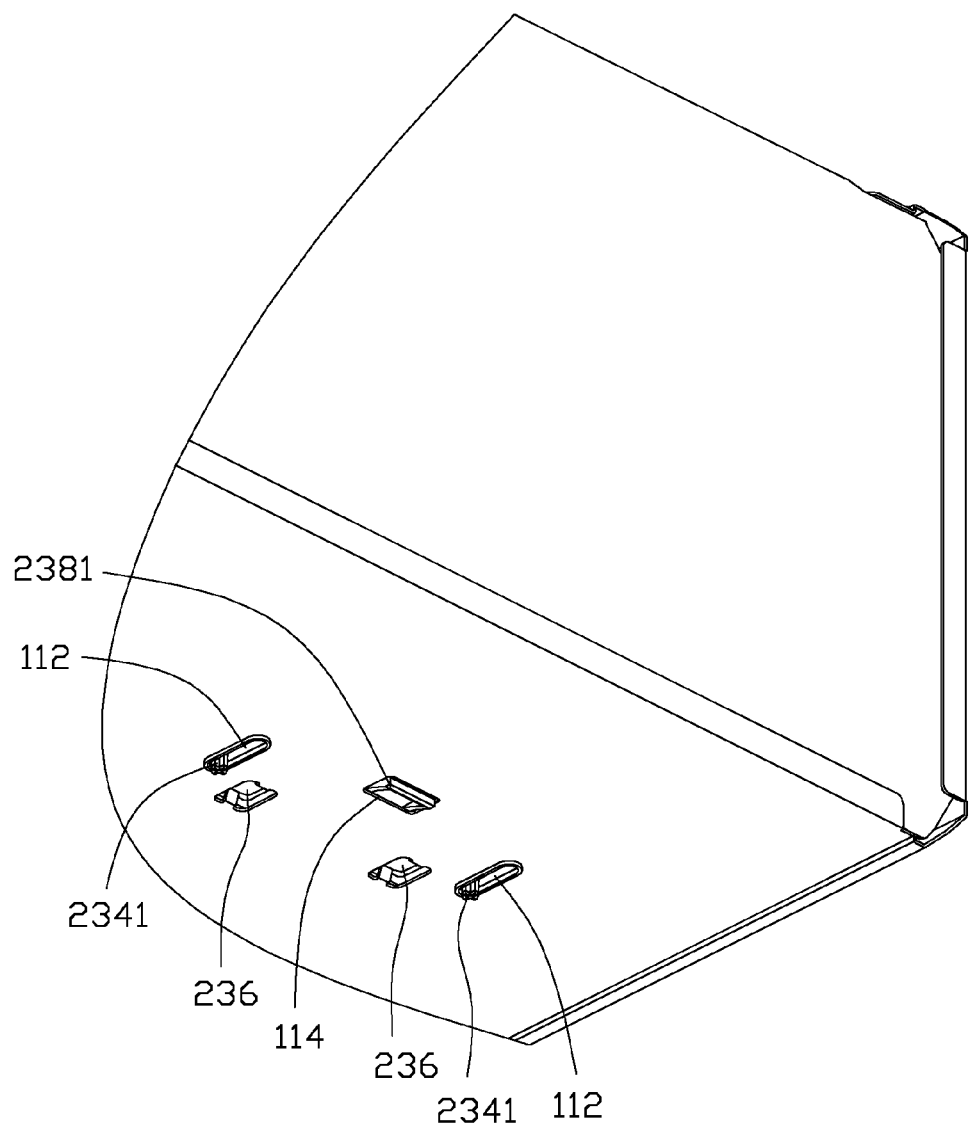
FIG. 5 is another assembled, cutaway view of an embodiment of the computer system of FIG. 4.

Referring also to FIGS. 4-5, in assembly, the motherboard 30 is fixed on the chassis bottom wall 11. The heat sink 50 is secured to the motherboard 30 on the chip 33. The first and second positioning posts 219, 239 are inserted in the mounting holes 61 of the fan 60. The guiding portion hook 217 and the latch hooks 2331 are engaged with the one fan wall 62. The fan 60 is thereby secured to the latch portion 23 of the duct 20.

The duct 20 together with the fan 60 is placed on the chassis bottom wall 11. The guiding portion 21 adjacent the heat sink 50. The blocking pieces 1161 of the chassis bottom wall 11 are inserted into the big portions 2373 of the receiving openings 237. The sliding posts 2341 are inserted into the sliding slots 112 of the chassis bottom wall 11. The locking portion 2381 of the clip 238 is positioned on the chassis bottom wall 11 adjacent to the positioning opening 114.

The duct 20 is pressed downwardly to resiliently deform the clip 238 and pushed to slide away from the chassis front wall 12. The sliding posts 2341 slide in the sliding slots 112. When the blocking pieces 1161 are engaged in the small portions 2371 of the receiving openings 237, the locking portion 2381 of the clip 238 will correspond to the positioning opening 114. The clip 238 rebounds to engage the locking portion 2381 in the positioning opening 114, to prevent the duct 20 from sliding towards the chassis front wall 12. The duct 20 is thus secured to the chassis bottom wall 11. The heat sink 50 is engaged between the first guiding wall 211 and the third guiding wall 214. The limiting portion 2110 of the duct 20 is positioned in the cutout 53 of the heat sink 50. The fan 60 is located between the guiding portion 21 and the chassis front wall 12. The guiding portion 21 of the duct 20 is positioned between the heat sink 50 and the fan 60. The clip 238 is positioned between the fan 60 and the chassis bottom wall 11.

In use, the fan 60 can guide airflow through the duct 20 to flow through the heat sink 50. This can improve heat dissipating efficiency for cooling the chip 33.

In disassembly, the locking portion 2381 of the clip 238 is disengaged from the positioning opening 114 by pulling the operating portion 2383. Then the duct 20 together with the fan 60 can be pushed to slide towards the chassis front wall 12. The duct 20 can then be removed from the chassis 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A computer system, comprising: a chassis comprising a chassis bottom wall and a chassis front wall substantially perpendicular to the chassis bottom wall; a motherboard with a chip secured to the chassis bottom wall; a heat sink secured to the motherboard for cooling the chip; a duct comprising a guiding portion and a latch portion located on the guiding portion, the latch portion secured to the chassis bottom wall, the guiding portion is adjacent to the heat sink to direct airflow to the heat sink; and a fan secured on the latch portion of the duct and located between the guiding portion and the chassis front wall; wherein the guiding portion of the duct is positioned between the heat sink and the fan; wherein a blocking piece is located on the chassis bottom wall; and the latch portion defines a receiving opening that receives the blocking piece, to prevent the duct from moving away from the chassis bottom wall.

2. The computer system of claim 1, wherein the chassis bottom wall defines a positioning opening; and a resiliently deformable clip is located on the latch portion and comprising a locking portion, which is engaged in the positioning opening to prevent the duct from moving along the chassis bottom wall and from disengaging the blocking piece from the receiving opening.

3. The computer system of claim 1, wherein the chassis bottom wall defines a sliding slot; and a sliding post is located on the latch portion to engage in the sliding slot and is slidable in the sliding slot when the duct is moved along the chassis bottom wall.

4. The computer system of claim 1, wherein the latch portion defines a convex portion; a projection is located in the convex portion; and the receiving opening is defined in the projection.

5. The computer system of claim 1, wherein a plurality of hooks is disposed on the duct and engaged with the fan.

6. The computer system of claim 5, wherein a plurality of positioning posts are disposed on the duct; and the fan defines a plurality of mounting holes that receive the plurality of positioning posts.

7. The computer system of claim 1, wherein the heat sink defines a cutout; and the guiding portion of the duct comprises a limiting portion to engage the cutout of the heat sink.

8. A computer system, comprising:
a chassis comprising a chassis bottom wall;
a motherboard with a chip secured to the chassis bottom wall, the chassis bottom wall defining a positioning opening;
a heat sink secured to the motherboard for cooling the chip;
a duct secured to the chassis bottom wall to direct airflow towards the heat sink, a resiliently deformable clip disposed on the duct; and
a fan secured on the duct;
wherein the clip is positioned between the fan and the chassis bottom wall and engaged in the positioning opening to prevent the duct from moving away from the heat sink.

9. The computer system of claim 8, wherein the duct comprising a guiding portion and a latch portion located on the guiding portion; the latch portion is secured to the chassis bottom wall; the guiding portion is adjacent to the heat sink to direct airflow to the heat sink.

10. The computer system of claim 9, wherein a blocking piece is located on the chassis bottom wall; and the latch portion defines a receiving opening that receives the blocking piece, to prevent the duct from moving away from the chassis bottom wall.

11. The computer system of claim 10, wherein the clip is located on the latch portion and comprising a locking portion, which is engaged in the positioning opening to prevent the duct from moving along the chassis bottom wall and from disengaging the blocking piece from the receiving opening.

12. The computer system of claim 10, wherein the chassis bottom wall defines a sliding slot; and a sliding post is located on the latch portion to engage in the sliding slot and is slidable in the sliding slot when the duct is moved along the chassis bottom wall.

13. The computer system of claim 10, wherein the latch portion defines a convex portion; a projection is located in the convex portion; and the receiving opening is defined in the projection.

14. The computer system of claim 9, wherein a plurality of hooks are disposed on the latch portion of the duct and engaged with the fan.

15. The computer system of claim 9, wherein a plurality of positioning posts are disposed on the latch portion of the duct; and the fan defines a plurality of mounting holes that receive the plurality of positioning posts.

16. The computer system of claim 9, wherein the heat sink defines a cutout; and the guiding portion of the duct comprises a limiting portion to engage the cutout of the heat sink.

* * * * *